L'I USOIU644236B2

(12) United States Patent
Howard et al.

(10) Patent No.: US 10,644,236 B2
(45) Date of Patent: May 5, 2020

(54) PHASE-CHANGE MATERIAL (PCM) RADIO FREQUENCY (RF) SWITCH WITH REDUCED PARASITIC CAPACITANCE

(71) Applicant: Newport Fab, LLC, Newport Beach, CA (US)

(72) Inventors: David J. Howard, Irvine, CA (US); Nabil El-Hinnawy, Irvine, CA (US); Gregory P. Slovin, Irvine, CA (US); Jefferson E. Rose, Hawthorne, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/216,008

(22) Filed: Dec. 11, 2018

(65) Prior Publication Data

US 2020/0058862 A1 Feb. 20, 2020

Related U.S. Application Data (63) Continuation-in-part of application No. 16/103,490, filed on Aug. 14, 2018, now Pat. No. 10,476,001, and
(Continued)

(51) Int. Cl.
*H01L 45/00* (2006.01)
*H01L 21/768* (2006.01)

(52) U.S. Cl.
CPC .......... *H01L 45/1286* (2013.01); *H01L 45/06* (2013.01); *H01L 45/1206* (2013.01);
(Continued)

(58) Field of Classification Search
CPC . H01L 45/1286; H01L 45/06; H01L 45/1206; H01L 45/144; H01L 45/14;
(Continued)

(56) References Cited

U.S. PATENT DOCUMENTS 5,976,932 A 11/1999 Kerber
6,448,576 B1 9/2002 Davis
(Continued)

FOREIGN PATENT DOCUMENTS

WO WO 2016/028362 2/2016

OTHER PUBLICATIONS

G. Slovin, et al. "AlN Barriers for Capacitance Reduction in Phase-Change RF Switches," in *IEEE Electron Device Letters*, vol. 37, No. 5, pp. 568-571, May 2016.
(Continued)

*Primary Examiner* — Michael M Trinh
(74) *Attorney, Agent, or Firm* — Farjami & Farjami LLP (57) ABSTRACT

A significantly reduced parasitic capacitance phase-change material (PCM) radio frequency (RF) switch includes an RF clearance zone including a step-wise structure of intermediate interconnect segments and vias to connect PCM contacts to setback top routing interconnects. The said RF clearance zone does not include cross-over interconnect segments. A low-k dielectric is situated in the RF clearance zone. A closed-air gap is situated in the RF clearance zone within the low-k dielectric. The setback top routing interconnects are situated higher over a substrate than the PCM contacts and the intermediate interconnect segments. The PCM RF switch may further include an open-air gap situated between the setback top routing interconnects.

20 Claims, 9 Drawing Sheets

Related U.S. Application Data a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993, and a continuation-in-part of application No. 16/114,106, filed on Aug. 27, 2018.

(52) U.S. Cl.
CPC ............ H01L 45/14 (2013.01); H01L 45/144 (2013.01); H01L 45/1608 (2013.01); H01L 45/1666 (2013.01); *H01L 21/7682* (2013.01)

(58) Field of Classification Search
CPC ............... H01L 45/141; H01L 45/1443; H01L 45/1666; H01L 45/1675; H01L 21/7682; H01L 21/764
See application file for complete search history.

(56) References Cited

U.S. PATENT DOCUMENTS

| | | | |
|---|---|---|---|
| 7,522,029 B1 | 4/2009 | Lantz | |
| 7,977,662 B2* | 7/2011 | Ryoo | H01L 27/2409 257/2 |
| 8,314,983 B2 | 11/2012 | Frank | |
| 9,257,647 B2 | 2/2016 | Borodulin | |
| 9,368,720 B1 | 6/2016 | Moon | |
| 9,640,759 B1 | 5/2017 | Curioni | |
| 9,755,063 B1 | 9/2017 | Howard | |
| 9,891,112 B1 | 2/2018 | Abel | |
| 9,917,104 B1 | 3/2018 | Roizin | |
| 2005/0127348 A1 | 6/2005 | Horak | |
| 2006/0246712 A1 | 11/2006 | Kim | |
| 2007/0075347 A1 | 4/2007 | Lai | |
| 2009/0065761 A1* | 3/2009 | Chen | H01L 23/5256 257/5 |
| 2010/0084626 A1 | 4/2010 | Delhougne | |
| 2010/0238720 A1 | 9/2010 | Tio Castro | |
| 2013/0187120 A1 | 7/2013 | Redaelli | |
| 2013/0285000 A1 | 10/2013 | Arai | |
| 2014/0191181 A1* | 7/2014 | Moon | H01L 27/2409 257/4 |
| 2014/0264230 A1* | 9/2014 | Borodulin | H01L 45/126 257/4 |
| 2015/0090949 A1 | 4/2015 | Chang | |
| 2016/0035973 A1 | 2/2016 | Raieszadeh | |
| 2016/0056373 A1* | 2/2016 | Goktepeli | H01L 45/1608 257/2 |
| 2016/0071653 A1 | 3/2016 | Lamorey | |
| 2016/0308507 A1 | 10/2016 | Engelen | |
| 2017/0092694 A1* | 3/2017 | BrightSky | H01L 27/2463 |
| 2017/0187347 A1 | 6/2017 | Rinaldi | |
| 2017/0365427 A1 | 12/2017 | Borodulin | |
| 2018/0005786 A1 | 1/2018 | Navarro | |
| 2018/0068941 A1 | 3/2018 | Howard | |
| 2018/0194615 A1 | 7/2018 | Nawaz | |
| 2018/0269393 A1 | 9/2018 | Zhang | |
| 2019/0064555 A1 | 2/2019 | Hosseini | |
| 2019/0067572 A1 | 2/2019 | Tsai | |
| 2019/0172657 A1 | 6/2019 | Zhu | |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

\* cited by examiner

PHASE-CHANGE MATERIAL (PCM) RADIO FREQUENCY (RF) SWITCH WITH REDUCED PARASITIC CAPACITANCE

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/103,587 filed on Aug. 14, 2018, now U.S. Pat. No. 10,476,001, titled "Design for High Reliability RF Switch Based on Phase-Change Material". The present application is also a continuation-in-part of and claims the benefit of and priority to application Ser. No. 16/103,646 filed on Aug. 14, 2018, now U.S. Pat. No. 10,461,253, titled "PCM RF Switch Fabrication with Subtractively Formed Heater". The present application is further a continuation-in-part of and claims the benefit of and priority to application Ser. No. 16/114,106 filed on Aug. 27, 2018, now U.S. Pat. No. 10,475,993, titled "Fabrication of Contacts in an RF Switch Having a Phase-Change Material (PCM) and a Heating Element". The disclosures and contents of all of the above-identified applications are hereby incorporated fully by reference into the present application.

The present application also incorporates fully by reference the entire disclosures in U.S. Pat. No. 9,755,063, issued on Sep. 5, 2017, and titled "RF SOI Switches Including Low Dielectric Constant Features Between Metal Line Structures," and U.S. Patent Application Publication No. 2018/0068941A1, published on Mar. 8, 2018, and titled "Copper Interconnect for Improving Radio Frequency (RF) Silicon-On-Insulator (SOI) Switch Field Effect Transistor (FET) Stacks" into the present application.

BACKGROUND

Radio frequency (RF) switches, such as field effect transistor (FET) type RF switches disclosed in U.S. Pat. No. 9,755,063, are devices commonly utilized in wireless communication devices (e.g., smart phones) to route signals through transmission paths between the device's processing circuitry and the device's antenna. Phase-change materials (PCM) are capable of transforming from a crystalline phase to an amorphous phase. These two solid phases exhibit differences in electrical properties, and RF switches can advantageously exploit these differences. However, the capability of phase-change materials for phase transformation depends heavily on how they are exposed to thermal energy and how they are allowed to release thermal energy. For example, in order to transform into an amorphous phase, phase-change materials may need to achieve temperatures of approximately seven hundred degrees Celsius (700° C.) or more, and may need to cool down within hundreds of nanoseconds.

Heating elements in PCM RF switches often contribute to parasitic capacitances associated with RF frequencies and result in performance tradeoffs. RF terminal interconnects, such as interconnects disclosed in U.S. Patent Application Publication No. 2018/0068941 A1, in RF switches also contribute parasitic capacitances.

Fabricating RF terminals for PCM RF switches without significant RF performance tradeoffs becomes complex, especially where the PCM RF switches are designed primarily around thermal performance. Accordingly, accommodating PCM in RF switches can present significant manufacturing challenges. Specialty manufacturing is often impractical, and large scale manufacturing generally trades practicality for the ability to control device characteristics and critical dimensions.

Thus, there is a need in the art to simply and reliably manufacture PCM RF switches having low parasitics.

SUMMARY

The present disclosure is directed to phase-change material (PCM) radio frequency (RF) switches with reduced parasitic capacitance, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1A:
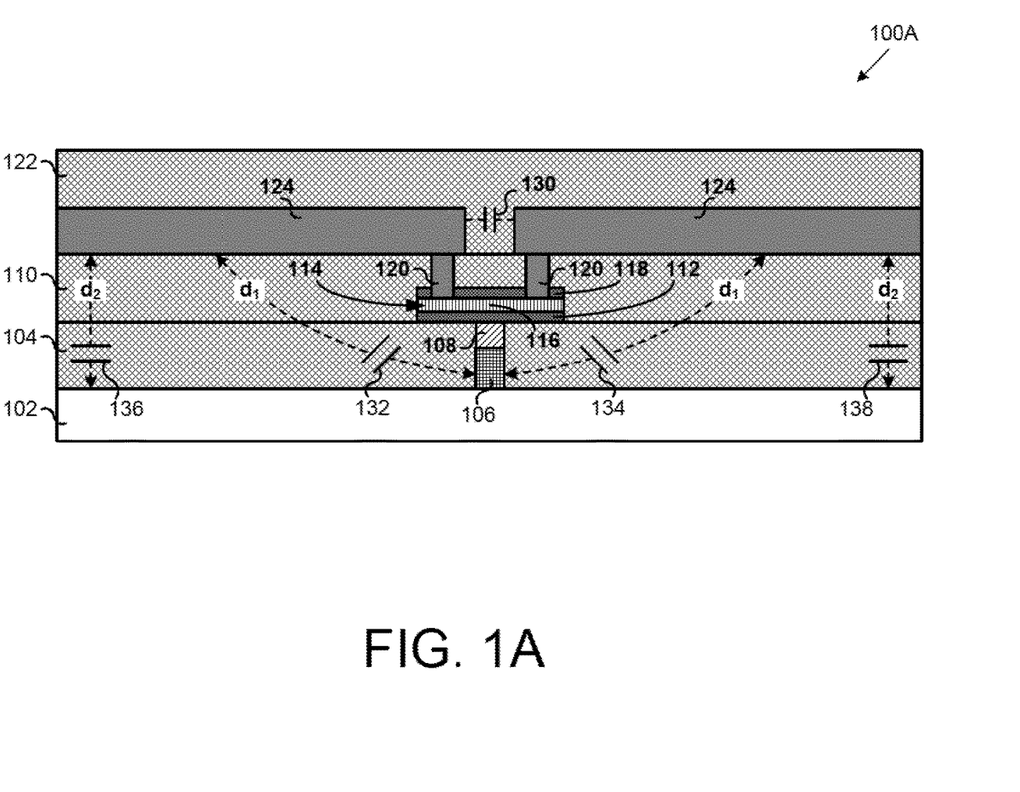
FIG. 1A illustrates a cross-sectional view of a portion of a phase-change material (PCM) radio frequency (RF) switch according to one implementation of the present application.

FIG. 1A illustrates a cross-sectional view of a portion of a phase-change material (PCM) radio frequency (RF) switch according to one implementation of the present application. As shown in FIG. 1A, PCM RF switch 100A includes substrate 102, dielectrics 104, 110, and 122, heating element 106, thermally conductive and electrically insulating material 108, optional conformability support layer 112, PCM 114 having active segment 116, optional contact uniformity support layer 118, PCM contacts 120, routing interconnects 124, and parasitic capacitors 130, 132, 134, 136, and 138.

Substrate 102 is situated under dielectric 104. In one implementation, substrate 102 is an insulator, such as silicon oxide ($SiO_2$). In various implementations, substrate 102 is a silicon (Si), silicon-on-insulator (SOI), sapphire, complementary metal-oxide-semiconductor (CMOS), bipolar CMOS (BiCMOS), or group III-V substrate. In various implementations, a heat spreader is integrated with substrate 102, or substrate 102 itself performs as a heat spreader. Substrate 102 can have additional layers (not shown in FIG. 1A). In one implementation, substrate 102 can comprise a plurality of interconnect metal levels and interlayer dielectric layers. Substrate 102 can also comprise a plurality of devices, such as integrated passive devices (not shown in FIG. 1A).

Dielectric 104 in PCM RF switch 100A is situated on top of substrate 102. As shown in FIG. 1A, dielectric 104 is also adjacent to sides of heating element 106 and thermally conductive and electrically insulating material 108. Dielectric 104 may comprise a material with thermal conductivity lower than that of thermally conductive and electrically insulating material 108. In various implementations, dielectric 104 can comprise silicon oxide ($SiO_2$), silicon nitride ($Si_xN_y$), or another dielectric.

Heating element 106 in PCM RF switch 100A is situated in dielectric 104. Heating element 106 also underlies active segment 116 of PCM 114. Heating element 106 generates a crystallizing heat pulse or an amorphizing heat pulse for transforming active segment 116 of PCM 114. Heating element 106 can comprise any material capable of Joule heating. Heating element 106 can be connected to electrodes of a current source (not shown in FIG. 1A) that generates a crystallizing current pulse or an amorphizing current pulse. Preferably, heating element 106 comprises a material that exhibits minimal or substantially no electromigration, thermal stress migration, and/or agglomeration. In various implementations, heating element 106 can comprise a metal such as tungsten (W). molybdenum (Mo), titanium (Ti), titanium tungsten (TiW), titanium nitride (TiN), tantalumn (Ta), nickel chromium (NiCr), or nickel chromium silicon (NiCrSi). For example, in one implementation, heating element 106 comprises tungsten lined with titanium and titanium nitride. Substrate 102 may be formed by a damascene process, a subtractive etch process, or any other suitable process.

Thermally conductive and electrically insulating material 108 in PCM RF switch 100A is situated on top of heating element 106 and under PCM 114 and, in particular, under active segment 116 of PCM 114. Thermally conductive and electrically insulating material 108 ensures efficient heat transfer from heating element 106 toward active segment 116 of PCM 114, while impeding electrical signals from leaking out from active segment 116 through PCM 114 to heating element 106 or to other neighboring structures. Thermally conductive and electrically insulating material 108 can comprise any material with high thermal conductivity and high electrical resistivity. In various implementations, thermally conductive and electrically insulating material 108 can comprise aluminum nitride (AlN), aluminum oxide ($Al_xO_y$), beryllium oxide ($Be_xO_y$), silicon carbide (SiC), diamond, or diamond-like carbon.

Dielectric 110 in PCM RF switch 100A is situated on top of dielectric 104. As shown in FIG. 1A, dielectric 110 is also adjacent to sides of PCM 114 and PCM contacts 120. In various implementations, dielectric 110 can comprise $SiO_2$, silicon nitride $Si_xN_y$, or another dielectric.

Optional conformability support layer 112 is situated over thermally conductive and electrically insulating material 108 and over dielectric 104. Optional conformability support layer 112 is a homogenous layer that allows PCM 114 to be formed substantially uniform with respect to that layer. In various implementations, optional conformability support layer 112 comprises $SiO_2$ and/or $Si_xN_y$. Optional conformability support layer 121 can be formed, for example, by plasma enhanced chemical vapor deposition (PECVD) or high density plasma CVD (HDP-CVD). In one implementation, optional conformability support layer 112 can have a thickness of approximately fifty angstroms to approximately five hundred angstroms (50 Å-500 Å).

PCM 114 in PCM RF switch 100A is situated over optional conformability support layer 112 (in case optional conformability support layer 112 is utilized) and over thermally conductive and electrically insulating material 108. PCM 114 includes active segment 116. Remaining segments of PCM 114 are passive segments. Active segment 116 of PCM 114 approximately overlies heating element 106. Passive segments of PCM 114 extend outward and are transverse to heating element 106, and are situated approximately under PCM contacts 120. As used herein, "active segment" refers to a segment of PCM that transforms between crystalline and amorphous phases, for example, in response to a crystallizing or an amorphizing heat pulse, whereas "passive segment" refers to a segment of PCM that does not make such transformation and maintains a crystalline phase (i.e., maintains a conductive state). With proper heat pulses and heat dissipation, active segment 116 of PCM 114 can transform between crystalline and amorphous phases, allowing PCM RF switch 100A to switch between ON and OFF states respectively.

PCM 114 can comprise germanium telluride ($Ge_xTe_y$), germanium antimony telluride ($Ge_xSb_yTe_z$), germnanium selenide ($Ge_xSe_y$), or any other chalcogenide. In various implementations, PCM 114 can be germanium telluride having from forty percent to sixty percent germanium by composition (i.e., $Ge_xTe_y$, where $0.4 \leq X \leq 0.6$ and $Y=1-X$). The material for PCM 114 can be chosen based upon ON state resistivity, OFF state electric field breakdown voltage, crystallization temperature, melting temperature, or other considerations. PCM 114 can be deposited, for example, by physical vapor deposition (PVD) sputtering, CVD, evaporation, or atomic layer deposition (ALD). It is noted that in FIG. 1A, current flowing in heating element 106 flows substantially under active segment 116 of PCM 114.

Optional contact uniformity support layer 118 is situated over PCM 114. Optional contact uniformity support layer 118 allows PCM 114 to remain substantially intact during formation of PCM contacts 120, as described below. In various implementations, optional contact uniformity support layer 118 comprises $SiO_2$ and/or $Si_xN_y$. Optional contact uniformity support layer 118 can be formed, for example, by PECVD or HDP-CVD. In one implementation, routing interconnects 124 can have a thickness of approximately fifty angstroms to approximately two thousand angstroms (50 Å-2000 Å).

PCM contacts 120 are situated in dielectric 110 and on top of passive segments of PCM 114. PCM contacts 120 provide RF signals to and from PCM 114. In this implementation, forming PCM contacts 120 may comprise two different etching actions. In the first etching action, dielectric 110 can be aggressively etched to form most of the PCM contact holes. This first etching action can use a selective etch, and optional contact uniformity support layer 118 can perform as an etch stop. In the second etching action, optional contact uniformity support layer 118 can be etched less aggressively. As a result, PCM 114 will remain substantially intact, and PCM contacts 120 can uniformly contact PCM 114. Because the $R_{ON}$ of PCM RF switch 100A depends heavily on the uniformity of contacts made with PCM 114, the $R_{ON}$ will be significantly lower when optional contact uniformity support layer 118 is used. In various implementations, PCM contacts 120 can comprise tungsten (W), copper (Cu), or aluminum (Al).

Routing interconnects 124 are situated over dielectric 110 and connected to PCM contacts 120. Routing interconnects 124 route RF signals from/to an external connection to/from PCM 114 through PCM contacts 120. Routing interconnects 124 facilitate external connections for PCM RF switch 100A and also improve signal handling. In one implementation, an metal layer is deposited at a first interlayer metal level, over dielectric 110 and over slot PCM contacts 120, and then a middle segment thereof is etched, thereby forming routing interconnects 124. In various implementations, routing interconnects 124 can comprise W. Cu. and/or Al. Dielectric 122 is situated over routing interconnects 124 and dielectric 110.

Although PCM RF switch 100A can more easily establish external connection and improve signal handling, notably, parasitic capacitors 130, 132, 134, 136, and 138 having undesirably high capacitance values are formed. Parasitic capacitor 130 is formed between respective routing interconnects 124. Parasitic capacitors 132 and 134 are formed between heating element 106 and respective routing interconnects 124, across distance $d_1$. Parasitic capacitors 136 and 138 are formed between substrate 102, which may include a heat spreader (not shown in FIG. 1A), and respective routing interconnects 124, across distance $d_2$. As described below, parasitic capacitors 130, 132, 134, 136, and 138 significantly degrade the frequency response of PCM RF switch 100A in both the ON and OFF states.

Figure 1B:
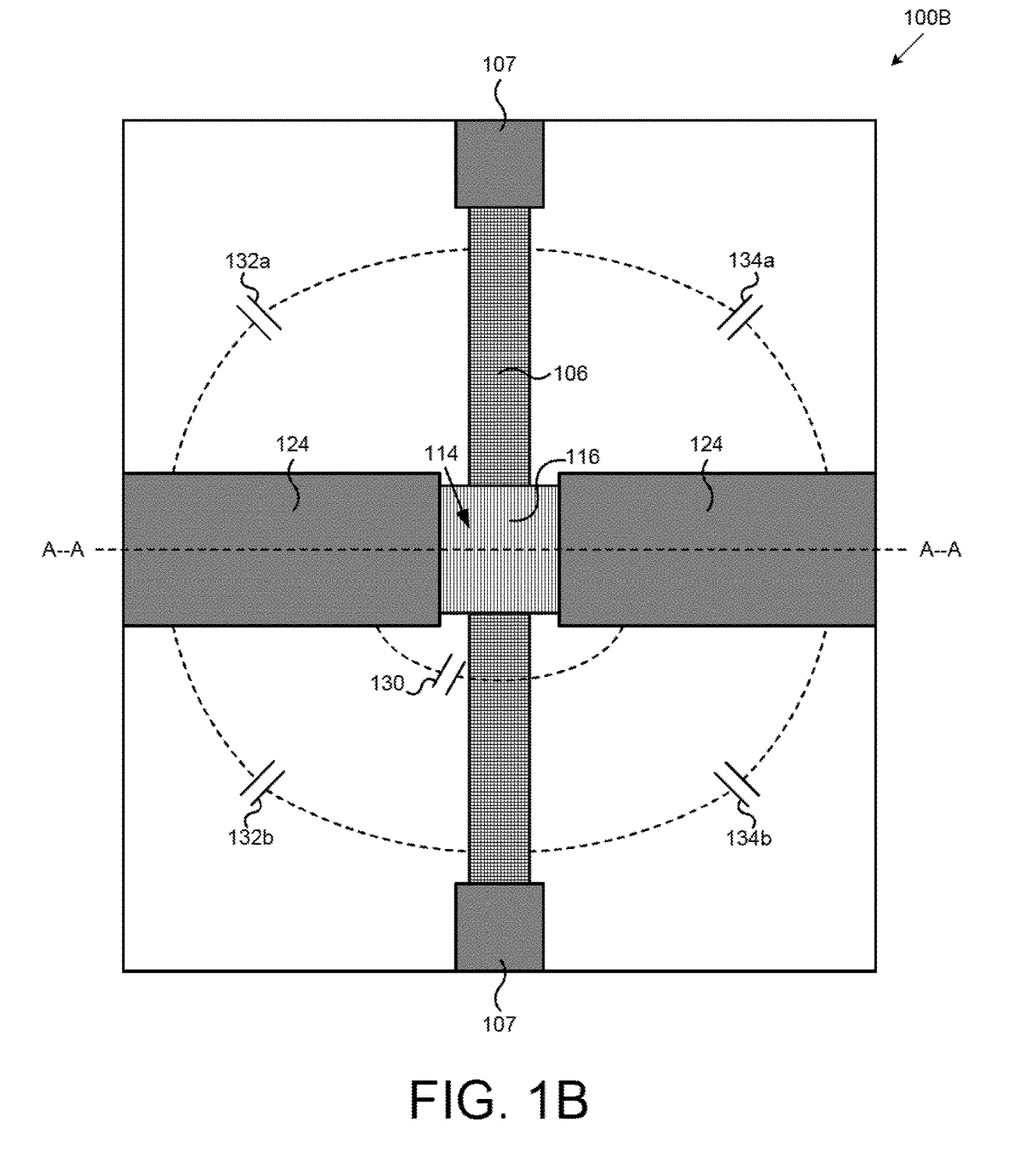
FIG. 1B illustrates a top view of a portion of a PCM RF switch corresponding to the PCM RF switch of FIG. 1A according to one implementation of the present application.

FIG. 1B illustrates a top view of a portion of a PCM RF switch corresponding to the PCM RF switch of FIG. 1A, except that only selected structures are shown. PCM RF switch 100A in FIG. 1A represents a cross-sectional view along line "A-A" of PCM RF switch 100B in FIG. 1B. As shown in FIG. 1B, heating element 106 underlies active segment 116 of PCM 114, and extends transverse to PCM 114. Heating element contacts 107 are connected to terminal segments of heating element 106. Routing interconnects 124 are situated at a first interlayer metal level and connected to PCM 114 through PCM contacts 120 (shown in FIG. 1A). Parasitic capacitor 130 is formed between respective routing interconnects 124. Parasitic capacitors 132a, 132b, 134a, and 134b are formed between heating element 106 and routing interconnects 124. Parasitic capacitors 132a and 132b in FIG. 1B together correspond to parasitic capacitor 132 in FIG. 1A. Likewise, parasitic capacitors 134a and 134b in FIG. 1B together correspond to parasitic capacitor 134 in FIG. 1A. As described above, parasitic capacitors 132a, 132b, 134a, and 134b significantly degrade the frequency response of PCM RF switch 100B in both the ON and OFF states.

Figure 2A:
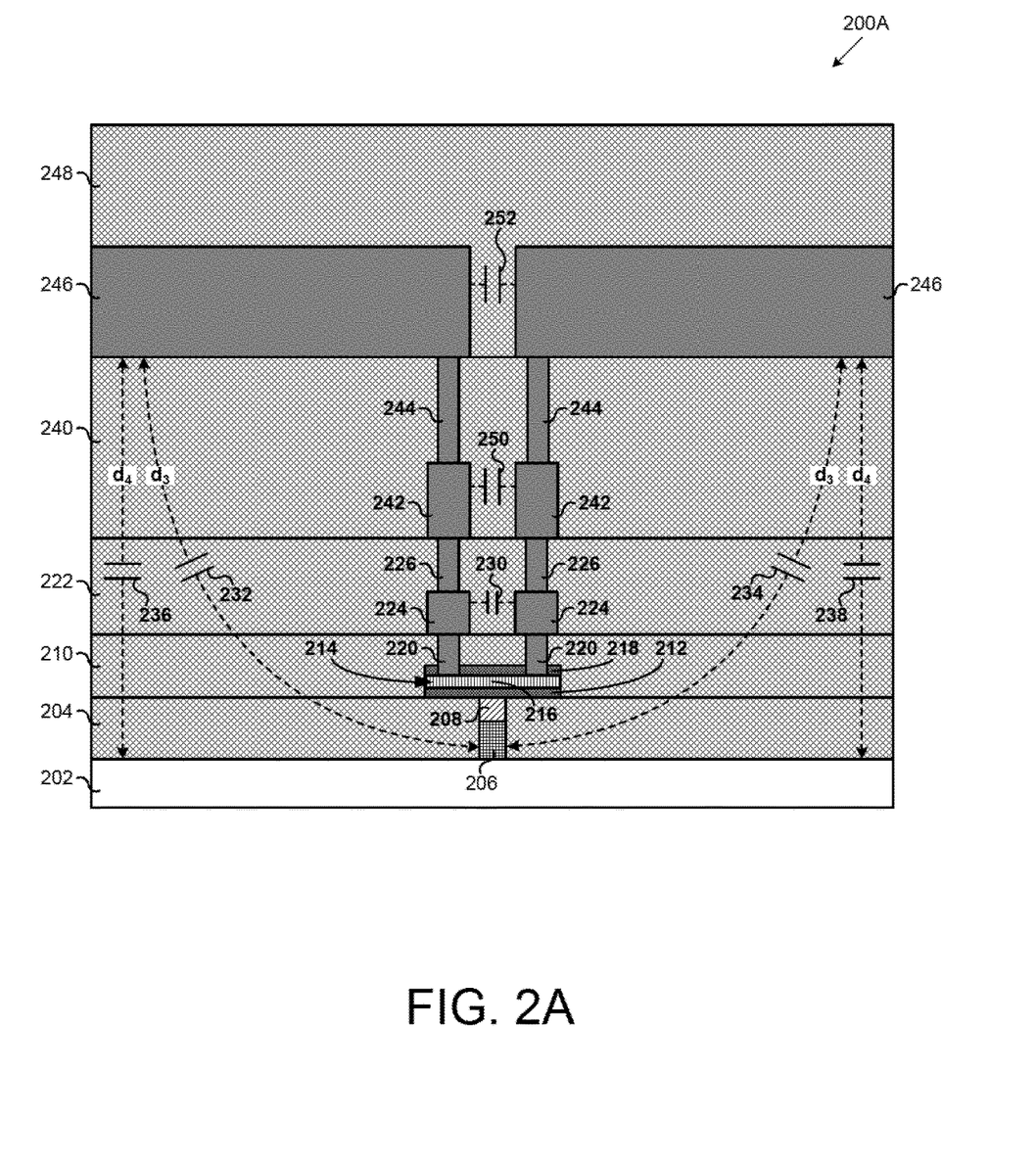
FIG. 2A illustrates a cross-sectional view of a portion of a PCM RF switch according to one implementation of the present application.

FIG. 2A illustrates a cross-sectional view of a portion of a PCM RF switch according to one implementation of the present application. As shown in FIG. 2A, PCM RF switch 200A includes substrate 202, dielectrics 204, 210, 222, 240, and 248, heating element 206, thermally conductive and electrically insulating material 208, optional conformability support layer 212, PCM 214 having active segment 216, optional contact uniformity support layer 218, PCM contacts 220, intermediate interconnect segments 224 and 242, vias 226 and 244, top routing interconnects 246, and parasitic capacitors 130, 132, 134, 136, and 138.

In PCM RF switch 200A, intermediate interconnect segments 224 are situated on PCM contacts 220, in dielectric 210, and under vias 226. Intermediate interconnect segments 242 are situated on vias 226, in dielectric 240, and under vias 244. Top routing interconnects 246 are situated on vias 244, in dielectric 248. PCM contacts 220, intermediate interconnect segments 224 and 242, vias 226 and 244, and top routing interconnects 246 (collectively referred to as "RF-IN and RF-OUT terminals") may be formed by subtractive etch processes, single danmascene processes, or any other suitable processes. In another implementation, these structures may be formed by dual damascene processes. For example, intermediate interconnect segments 242 and vias 226 may be formed from the same metal deposit using a dual damascene process such that no metal-to-metal interface exists therebetween. In various implementations, PCM contacts 220, intermediate interconnect segments 224 and 242, vias 226 and 244, and top routing interconnects 246 may comprise W, Cu, and/or Al. In various implementations, PCM RF switch 200A can include more or fewer intermediate metal segments having different sizes or shapes and situated on or extending through different layers.

Because PCM RF switch 200A includes intermediate interconnect segments 224 and 242 and vias 226 and 244, top routing interconnects 246 in PCM RF switch 200A are situated at a higher interlayer metal level relative to routing interconnects 124 in PCM RF switch 100A. For example, routing interconnects 124 in PCM RF switch 100A are situated at a first interlayer metal level, while top routing interconnects 246 in PCM RF switch 200A are situated at a third interlayer metal level. As a result, distance $d_3$ between heating element 206 and respective top routing interconnects 246 in PCM RF switch 200A is greater relative to distance $d_1$ between heating element 106 and respective routing interconnects 124 in PCM RF switch 100A, and the capacitance values of parasitic capacitors 232 and 234 in PCM RF switch 200A are reduced relative to the capacitance values of parasitic capacitors 132 and 134 in PCM RF switch 100A. Likewise, distance $d_4$ between substrate 202 and respective top routing interconnects 246 in PCM RF switch 200A is greater relative to distance $d_2$ between substrate 102 and respective routing interconnects 124 in PCM RF switch 100A, and the capacitance values of parasitic capacitors 236 and 238 in PCM RF switch 200A are reduced relative to the capacitance values of parasitic capacitors 136 and 138 in PCM RF switch 100A.

However, because PCM RF switch 200A includes intermediate interconnect segments 224 and 242, vias 226 and 244, and top routing interconnects 246, parasitic capacitors 230, 250, and 252 are formed at the first, second, and third interlayer metal levels respectively, between intermediate interconnect segments 224, intermediate interconnect segments 242, and top routing interconnects 246 respectively. Parasitic capacitor 230 in PCM RF switch 200A generally corresponds to parasitic capacitor 130 in PCM RF switch 100A. Parasitic capacitors 230, 250, and 252 all contribute to degrading the frequency response of PCM RF switch 200A. Thus, parasitic capacitors 250 and 252 in PCM RF switch 200A represent increased parasitic capacitance relative to PCM RF switch 100A.

As is typical when multi-level metallization is employed, the thicknesses of intermediate interconnect segments 242 and top routing interconnects 246, which are situated at a higher interlayer metal level, are greater than the thickness of intermediate interconnect segments 224. Because intermediate interconnect segments 224 and 242 and top routing interconnects 246 in PCM RF switch 200A are substantially aligned over passive segments of PCM 214, these greater thicknesses cause the capacitance values of parasitic capacitors 250 and 252 to be increased relative to the capacitance values of parasitic capacitor 230. Thus, the total capacitance value of parasitic capacitors 230, 250, and 252 in PCM RF switch 200A would not be merely triple the capacitance value of parasitic capacitor 130 in PCM RF switch 100A, rather, the total capacitance value of parasitic capacitors 230, 250, and 252 in PCM RF switch 200A would be even greater.

In one approach, the dimensions of PCM 214 and the spacing between RF-IN and RF-OUT terminals are increased, in order to reduce the capacitance values of parasitic capacitors 230, 250, and 252. However, this approach detrimentally increases the ON state resistance ($R_{ON}$) of PCM RF switch 200A. Further, this approach could alter the rate at which active segment 216 of PCM 214 crystallizes or amorphizes (i.e., how fast PCM RF switch 200A turns OFF or ON) in response to heat pulse from heating element 206.

Figure 2B:
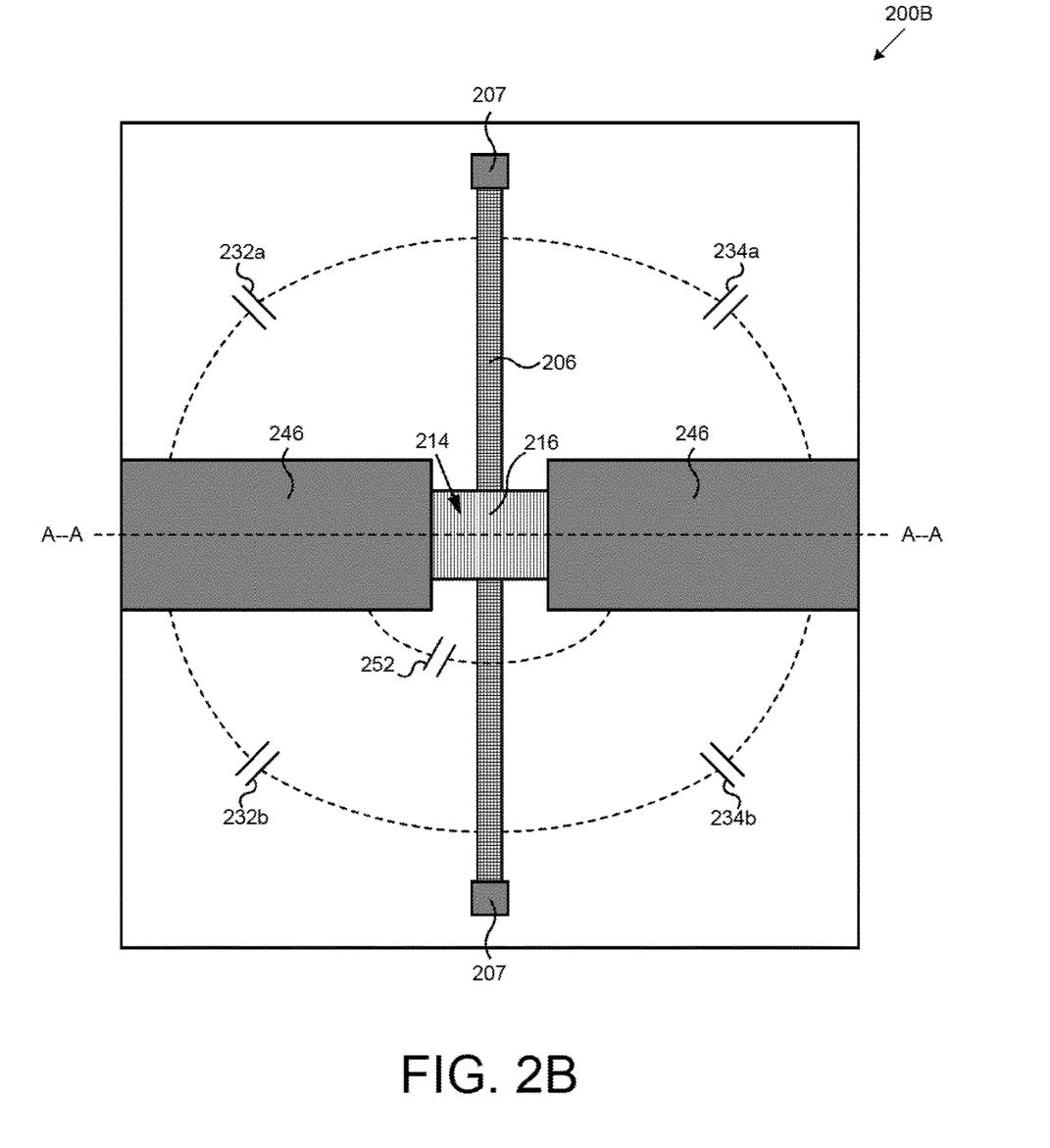
FIG. 2B illustrates a top view of a portion of a PCM RF switch corresponding to the PCM RF switch of FIG. 2A according to one implementation of the present application.

FIG. 2B illustrates a top view of a portion of a PCM RF switch corresponding to the PCM RF switch of FIG. 2A, except that only selected structures are shown. PCM RF switch 200A in FIG. 2A represents a cross-sectional view along line "A-A" of PCM RF switch 200B in FIG. 2B. As shown in FIG. 2B, heating element 206 underlies active segment 216 of PCM 214, and extends transverse to PCM 214. Heating element contacts 207 are connected to terminal segments of heating element 206. Top routing interconnects 246 are situated at a third interlayer metal level and connected to PCM 214 through vias 244, intermediate interconnect segments 242, vias 226, intermediate interconnect segments 224, and PCM contacts 220 (shown in FIG. 2A). Whereas heating element 106, heating element contacts 107, and PCM 114 are illustrated larger relative to routing interconnects 124 in FIG. 1B, heating element 206, heating element contacts 207, and PCM 214 are illustrated smaller relative to top routing interconnects 246 in FIG. 2B to illustrate that top routing interconnects 246 in FIG. 2B are situated at a higher interlayer metal level relative to routing interconnects 124 in FIG. 1B.

Parasitic capacitors 232a, 232b, 234a, and 234b are formed between heating element 206 and top routing interconnects 246. Parasitic capacitors 232a and 232b in FIG. 2B together correspond to parasitic capacitor 232 in FIG. 2A. Likewise, parasitic capacitors 234a and 234b in FIG. 2B together correspond to parasitic capacitor 234 in FIG. 2A. As described above, because PCM RF switch 200A includes intermediate interconnect segments 224 and 242 and vias 226 and 244 (shown in FIG. 2A), top routing interconnects 246 in PCM RF switch 200B are situated at a higher interlayer metal level relative to routing interconnects 124 in PCM RF switch 100B, and the capacitance values of parasitic capacitors 232a, 232b, 234a, and 234b in PCM RF switch 200B are reduced relative to the capacitance values of parasitic capacitors 132a, 132b, 134a, and 134b in PCM RF switch 100B.

Parasitic capacitor 252 is formed between respective top routing interconnects 246. Additionally, parasitic capacitors 250 and 230 (shown in FIG. 2A) are formed underneath. As described above, parasitic capacitors 230, 250, and 252 all contribute to degrading the frequency response of PCM RF switch 200B, and parasitic capacitors 250 and 252 represent increased parasitic capacitance relative to PCM RF switch 100B.

Figure 3A:
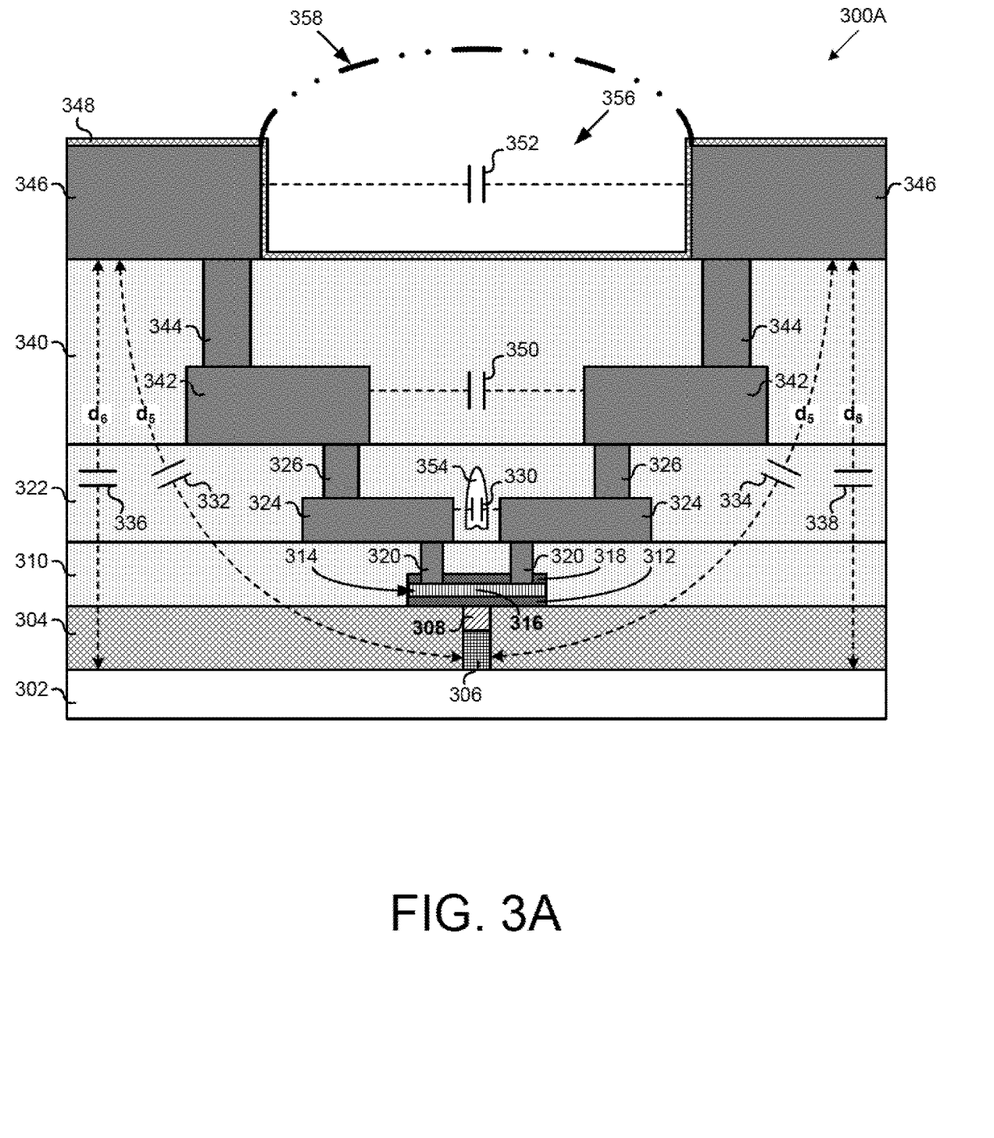
FIG. 3A illustrates a cross-sectional view of a portion of a PCM RF switch according to one implementation of the present application.

FIG. 3A illustrates a cross-sectional view of a portion of a PCM RF switch according to one implementation of the present application. As shown in FIG. 3A, PCM RF switch 300A includes substrate 302, dielectric 304, low-k dielectrics 310, 322, and 340, passivation 348, heating element 306, thermally conductive and electrically insulating material 308, optional conformability support layer 312, PCM 314 having active segment 316, optional contact uniformity support layer 318, PCM contacts 320, intermediate interconnect segments 324 and 342, vias 326 and 344, setback top routing interconnects 346, parasitic capacitors 330, 332, 334, 336, 338, 350, and 352, closed-air gap 354, and open-air gap 356, and "RF clearance zone" 358.

As discussed above, because PCM RF switch 300A includes intermediate interconnect segments 324 and 342 and vias 326 and 344, setback top routing interconnects 346 in PCM RF switch 300A are situated at a higher interlayer metal level relative to routing interconnects 124 in PCM RF switch 100A. Distance $d_5$ between heating element 306 and respective setback top routing interconnects 346 in PCM RF switch 300A is greater relative to distance $d_1$ between heating element 106 and respective routing interconnects 124 in PCM RF switch 100A, and the capacitance values of parasitic capacitors 332 and 334 in PCM RF switch 300A are reduced relative to the capacitance values of parasitic capacitors 132 and 134 in PCM RF switch 100A. Likewise, distance $d_6$ between substrate 302 and respective setback top routing interconnects 346 in PCM RF switch 300A is greater relative to distance $d_2$ between substrate 102 and respective routing interconnects 124 in PCM RF switch 100A, and the capacitance values of parasitic capacitors 336 and 338 in PCM RF switch 300A are reduced relative to the capacitance values of parasitic capacitors 136 and 138 in PCM RF switch 100A.

In PCM RF switch 300A, PCM contacts 320, intermediate interconnect segments 324 and 342, vias 326 and 344, and setback top routing interconnects 346 (collectively referred to as "RF-IN and RF-OUT terminals") have a step-wise structure. As used herein, "step-wise structure" refers to interconnects at higher metal levels having greater distance from each other relative to interconnects to which they are connected at lower metal levels. For example, intermediate interconnect segments 342 at the second metal level have a greater distance from each other, while intermediate interconnect segments 324 to which they are connected at the first metal level have a lesser distance from each other. Similarly, "setback top routing interconnects" refers to interconnects at the highest metal level of RF-IN and RF-OUT terminals having the greatest distance from each other relative to other interconnects to which they are connected. In various implementations, PCM RF switch 300A can include more or fewer intermediate metal segments having different sizes or shapes and situated on or extending through different layers.

PCM RF switch 300A includes low-k dielectric 310, 322, and 340. Low-k dielectric 310 is situated over dielectric 304, and has PCM 314 and PCM contacts 320 situated therein. Low-k dielectric 322 is situated over low-k dielectric 310, and has intermediate interconnect segments 324 and vias 326 situated therein. Low-k dielectric 340 is situated over low-k dielectric 322 and under setback top routing interconnects 346, and has intermediate interconnect segments 342 and vias 344 situated therein. Low-k dielectrics 310, 322, and 340 can be any dielectric having dielectric constant less than conventional silicon dioxide. In various implementations, low-k dielectrics 310, 322, and 340 can comprise carbon-doped silicon oxide, porous silicon oxide, porous carbon-doped silicon oxide, spin-on organic polymer, spin-on silicon based polymer, fluorinated amorphous carbon, aromatic hydrocarbon, parylene, polyarylene ether, silsesquioxane, fluorinated silicon dioxide, and diamondlike carbon. In one implementation, dielectric 304 can be low-k dielectric. Although low-k dielectrics 310, 322, and 340 are shown sequentially stacked in FIG. 3A, additional structures, for example, etch stop layers, can be situated therebetween.

Closed-air gap 354 is situated in low-k dielectric 322 between intermediate interconnect segments 324 and between vias 326. In one implementation, closed-air gap 354 is formed automatically when low-k dielectric 322 is formed using a pinch-off deposition. Where intermediate interconnect segments 324 have an appropriate spacing, depositing low-k dielectric 322 using a non-conformal low gap-fill process, such as CVD, can cause low-k dielectric 322 to pinch-off between intermediate interconnect segments 324 near their top surfaces, thereby automatically forming closed-air gap 354. In an alternative implementation, closed-air gap 354 is formed by removing a sacrificial material though a permeable dielectric cap. As described below, closed-air gap 354 further reduces the capacitance value of parasitic capacitor 330.

Open-air gap 356 is situated between setback top routing interconnects 346. In this implementation, setback top routing interconnects 346 are situated at a topmost interlayer metal level in PCM RF switch 300A. An interlayer dielectric, such as dielectric 248 in FIG. 2A, is not situated over setback top routing interconnects 346. Rather, passivation 348 is situated conformably over setback top routing interconnects 346, such that open-air gap 356 is formed. As described below, open-air gap 356 further reduces the capacitance value of parasitic capacitor 352. In one implementation, an open-air gap can also be formed between intermediate interconnect segments 342, for example, by etching portion of low-k dielectric 340.

In PCM RF switch 300A, "RF clearance zone" 358 is formed. As used herein, "RF clearance zone" refers to the step-wise structure of intermediate interconnect segments 324 and 342 and vias 326 and 344, along with the region between the RF terminals of PCM RF switch 300A. No other interconnects cross over the RF terminals or PCM 314 in RF clearance zone 358. In PCM RF switch 300A, "RF clearance zone" 358 includes the step-wise structure of intermediate interconnect segments 324 and 342 and vias 326 and 344, portions of low-k dielectrics 310, 322, and 340 and portions of passivation 348 between the RF terminals, closed-air gap 354, as well as open-air gap 356.

Figure 3B:
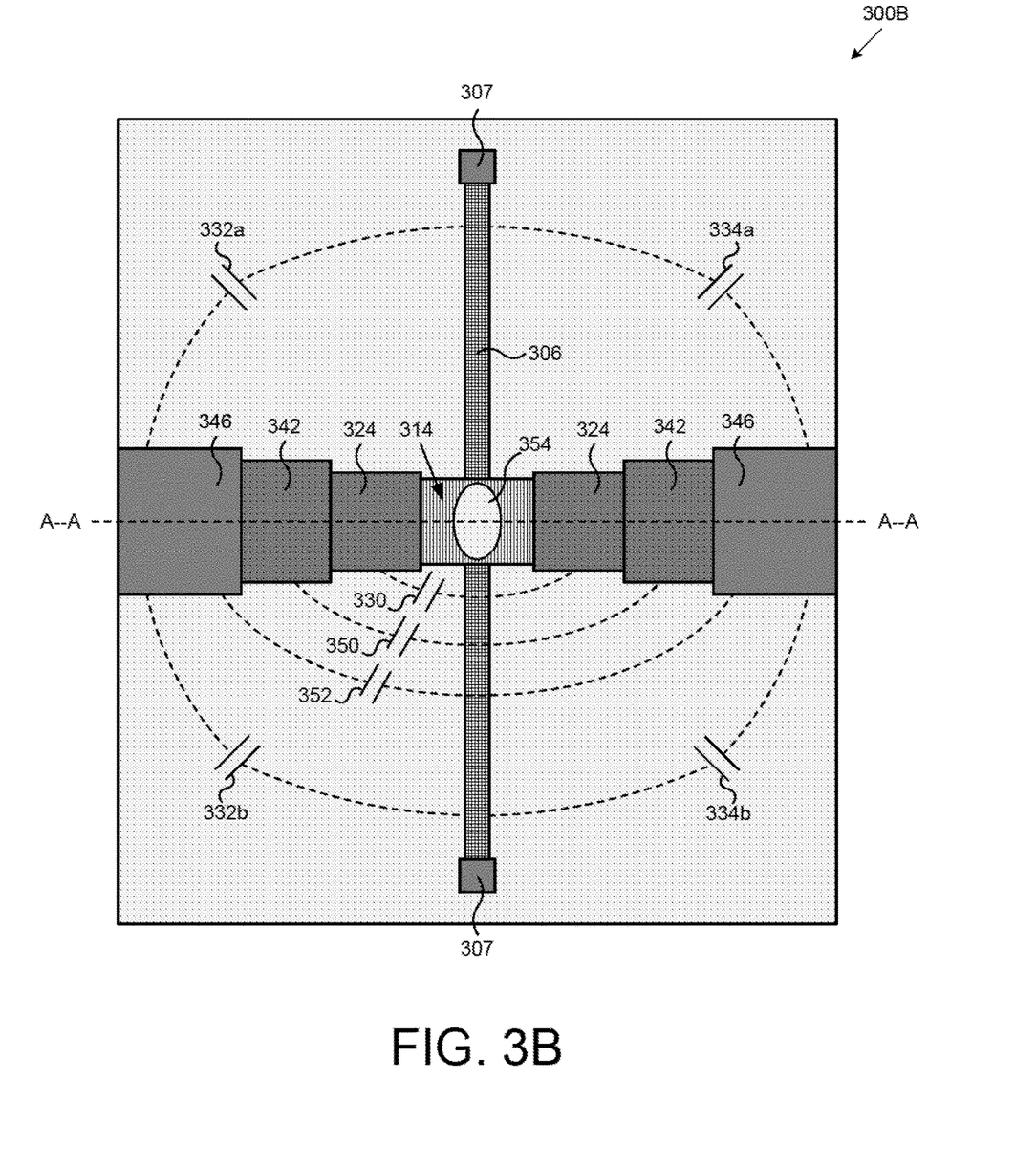
FIG. 3B illustrates a top view of a portion of a PCM RF switch corresponding to the PCM RF switch of FIG. 3A according to one implementation of the present application.

FIG. 3B illustrates a top view of a portion of a PCM RF switch corresponding to the PCM RF switch of FIG. 3A, except that only selected structures are shown. PCM RF switch 300A in FIG. 3A represents a cross-sectional view along line "A-A" of PCM RF switch 300B in FIG. 3B. As shown in FIG. 3B, heating element 306 underlies an active segment of PCM 314, and extends transverse to PCM 314. Heating element contacts 307 are connected to terminal segments of heating element 206. Setback top routing interconnects 346 are situated at a third interlayer metal level and connected to PCM 314 through vias 344 (shown in FIG. 3A), intermediate interconnect segments 342, vias 326 (shown in FIG. 3A), intermediate interconnect segments 324, and PCM contacts 320 (shown in FIG. 3A). Whereas heating element 106, heating element contacts 107, and PCM 114 are illustrated larger relative to routing interconnects 124 in FIG. 1B, heating element 306, heating element contacts 307, and PCM 314 are illustrated smaller relative to setback top routing interconnects 346 in FIG. 3B to illustrate that setback top routing interconnects 346 in FIG. 3B are situated at a higher interlayer metal level relative to routing interconnects 124 in FIG. 1B. Also shown in FIG. 3B is closed-air gap 354 between intermediate interconnect segments 324.

Parasitic capacitors 332a, 332b, 334a, and 334b are formed between heating element 306 and top routing interconnects 346. Parasitic capacitors 332a and 332b in FIG. 3B together correspond to parasitic capacitor 332 in FIG. 3A. Likewise, parasitic capacitors 334a and 334b in FIG. 3B together correspond to parasitic capacitor 334 in FIG. 3A. As described above, Because PCM RF switch 300B includes intermediate interconnect segments 324 and 342 and vias 326 and 344 (shown in FIG. 3A), setback top routing interconnects 346 in PCM RF switch 300B are situated at a higher interlayer metal level relative to routing interconnects 124 in PCM RF switch 100B, and the capacitance values of parasitic capacitors 332a, 332b, 334a, and 334b in PCM RF switch 300B are reduced relative to the capacitance values of parasitic capacitors 132a, 132b, 134a, and 134b in PCM RF switch 100B. As described below, because PCM RF switch 300B uses low-k dielectrics 310, 322, and 340 (shown in FIG. 3A), the capacitance values of parasitic capacitors 332a, 332b, 334a, and 334b in PCM RF switch 300B are further reduced relative to the capacitance values of parasitic capacitors 232a, 232b, 234a, and 234b in PCM RF switch 200B.

Parasitic capacitors 330, 350, and 352 are formed between intermediate interconnect segments 324, intermediate interconnect segments 342, and setback top routing interconnects 346 respectively. As described below, the step-wise structure of the RF terminals and low-k dielectrics 310, 322, and 340 (shown in FIG. 3A) reduce the capacitance values of parasitic capacitors 330, 350, and 352. As also described below, closed-air gap 354 and open-air gap 356 (shown in FIG. 3A) further reduce the capacitance values of parasitic capacitors 330 and 352.

Figure 4A:
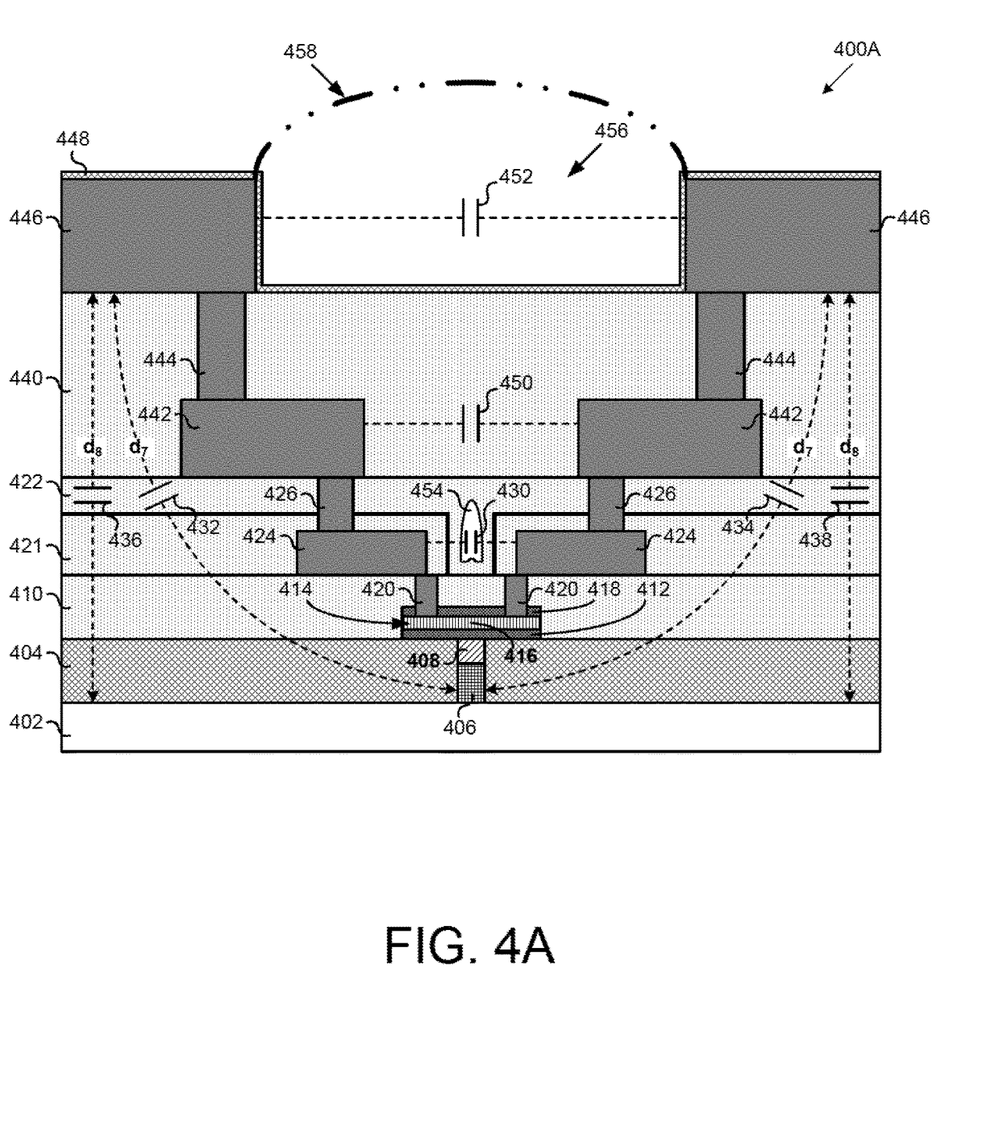
FIG. 4A illustrates a cross-sectional view of a portion of a PCM RF switch according to one implementation of the present application.

FIG. 4A illustrates a cross-sectional view of a portion of a PCM RF switch according to one implementation of the present application. As shown in FIG. 4A, PCM RF switch 400A includes substrate 402, dielectric 404, low-k dielectrics 410, 421, 422, and 440, passivation 448, heating element 406, thermally conductive and electrically insulating material 408, optional conformability support layer 412, PCM 414 having active segment 416, optional contact uniformity support layer 418, PCM contacts 420, intermediate interconnect segments 424 and 442, vias 426 and 444, setback top routing interconnects 446, parasitic capacitors 430, 432, 434, 436, 438, 450, and 452, closed-air gap 454, and open-air gap 456, and RF clearance zone 458. PCM RF switch 400A in FIG. 4A generally corresponds to PCM RF switch 300A in FIG. 3A, except for differences described below. For example, substrate 402, heating element 406, distance $d_7$, and distance $d_8$ in PCM RF switch 400A generally correspond to substrate 302, heating element 306, distance $d_5$, and distance $d_6$ in PCM RF switch 300A.

As shown in FIG. 4A, intermediate interconnect segments 424 have an offset (relative to PCM contacts 420) away from active segment 416 of PCM 414. Intermediate interconnect segments 424 are offset away from active segment 416, such that intermediate interconnect segments 424 have a greater distance between each other than PCM contacts 420. PCM contacts 420 generally correspond to PCM contacts 320. Accordingly, the capacitance value of parasitic capacitor 430 formed between intermediate interconnect segments 424 in FIG. 4A is reduced relative to the capacitance value of parasitic capacitor 330 formed between intermediate interconnect segments 324 in FIG. 3A.

PCM RF switch 400A includes low-k dielectrics 421 and 422. Closed-air gap 354 situated in low-k dielectric 422 between intermediate interconnect segments 424 and between vias 426. In the present implementation closed-air gap 454 is formed using two dielectric deposition, because the offset of intermediate interconnect segments 424 creates a spacing too large for a pinch-off to occur. In the first dielectric deposition, low-k dielectric 421 is deposited over low-k dielectric 410, PCM contacts 420, and intermediate interconnect segments 424. Next, a trench having appropriate spacing for pinch-off to occur is formed in low-k dielectric 421. In one implementation, an etch stop may be used to define the bottom of this trench. Then, in the second dielectric deposition, low-k dielectric 422 is deposited over low-k dielectric 421 using a non-conformal low gap-fill process, such as CVD, causing low-k dielectric 422 to pinch-off between intermediate interconnect segments 424 near their top surfaces, thereby forming closed-air gap 454. In an alternative implementation, closed-air gap 454 is formed by removing a sacrificial material though a permeable dielectric cap. As described below, closed-air gap 454 further reduces the capacitance value of parasitic capacitor 430.

Figure 4B:
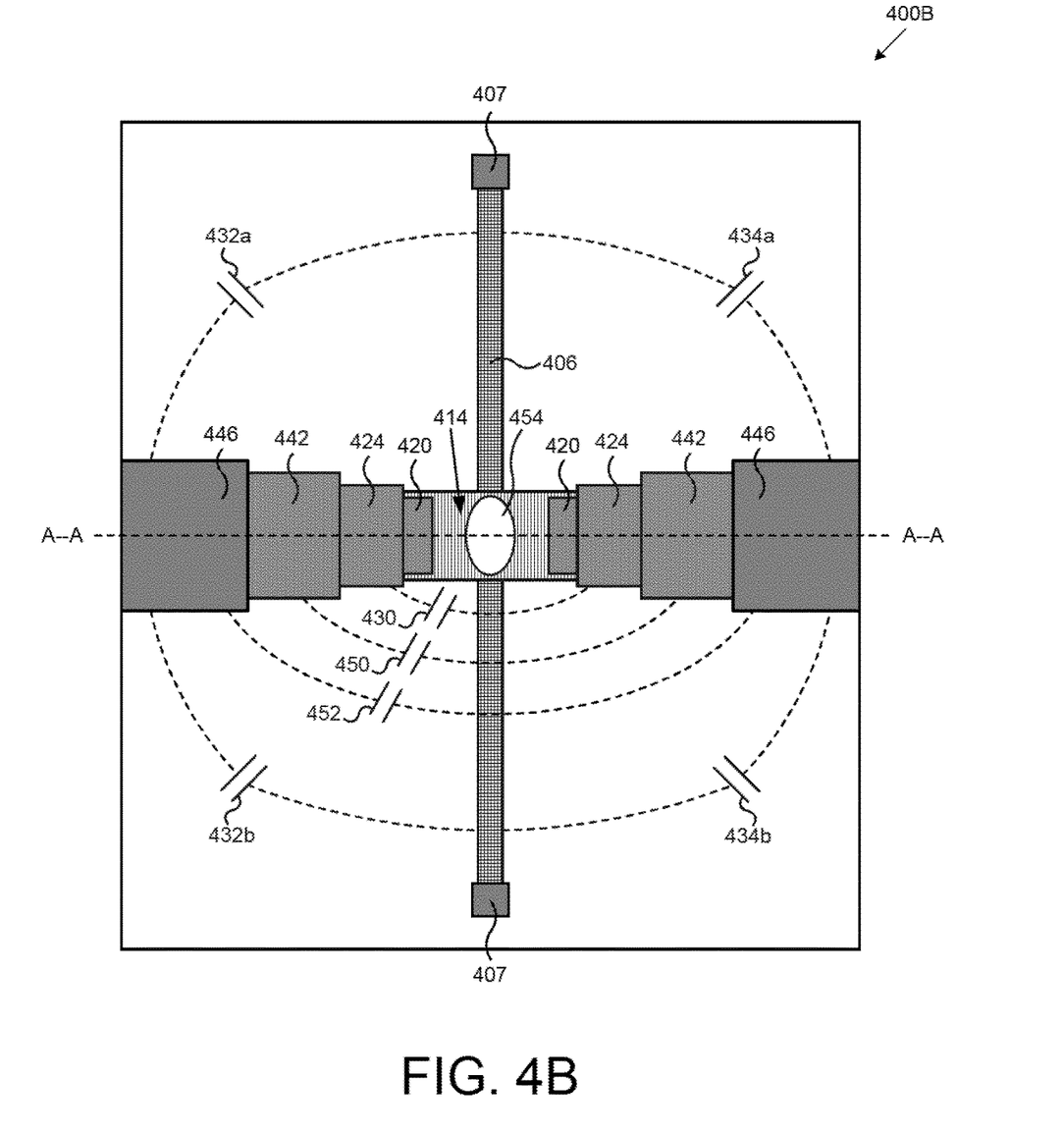
FIG. 4B illustrates a top view of a portion of a PCM RF switch corresponding to the PCM RF switch of FIG. 4A according to one implementation of the present application.

FIG. 4B illustrates a top view of a portion of a PCM RF switch corresponding to the PCM RF switch of FIG. 4A, except that only selected structures are shown. PCM RF switch 400A in FIG. 4A represents a cross-sectional view along line "A-A" of PCM RF switch 400B in FIG. 4B. As shown in FIG. 4B, heating element 406 underlies an active segment of PCM 414, and extends transverse to PCM 414. Heating element contacts 407 are connected to terminal segments of heating element 406. Setback top routing interconnects 446 are situated at a third interlayer metal level and connected to PCM 414 through vias 444 (shown in FIG. 4A), intermediate interconnect segments 442, vias 426 (shown in FIG. 4A), intermediate interconnect segments 424, and PCM contacts 420. Whereas heating element 106, heating element contacts 107, and PCM 114 are illustrated larger relative to routing interconnects 124 in FIG. 1B, heating element 306, heating element contacts 407, and PCM 414 are illustrated smaller relative to setback top routing interconnects 446 in FIG. 4B to illustrate that setback top routing interconnects 446 in FIG. 4B are situated at a higher interlayer metal level relative to routing interconnects 124 in FIG. 1B. Also shown in FIG. 4B is closed-air gap 454 between intermediate interconnect segments 424.

Parasitic capacitors 432a, 432b, 434a, and 434b are formed between heating element 406 and top routing interconnects 446. Parasitic capacitors 430, 450, and 452 are formed between intermediate interconnect segments 424, intermediate interconnect segments 442, and setback top routing interconnects 446 respectively. Parasitic capacitors 432a, 432b, 434a, 434b, 430, 450, and 452 in FIG. 4B generally correspond to parasitic capacitors 332a, 332b, 334a, 334b, 330, 350, and 352 in FIG. 3B, except for differences described below.

As described above, intermediate interconnect segments 424 have an offset (relative to PCM contacts 420) away from the active segment of PCM 414. Notably, PCM contacts 420 are visible in the top view of FIG. 4B. Because intermediate interconnect segments 424 have an offset, the capacitance value of parasitic capacitor 430 formed between intermediate interconnect segments 424 in FIG. 4B is reduced relative to the capacitance value of parasitic capacitor 330 formed between intermediate interconnect segments 324 in FIG. 3B.

Figure 5:
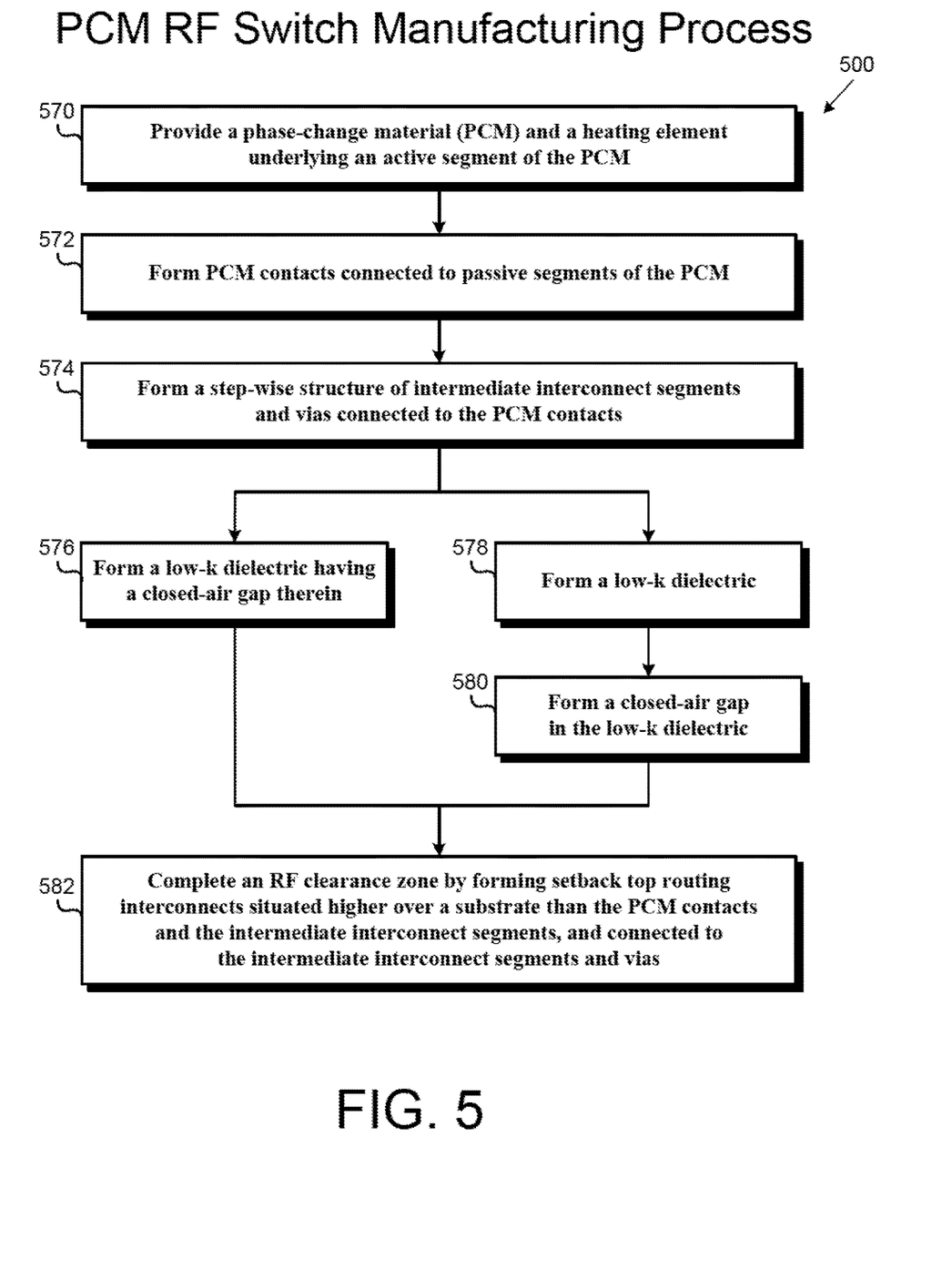
FIG. 5 illustrates a portion of a flowchart of an exemplary method for manufacturing a PCM RF switch according to one implementation of the present application.

FIG. 5 illustrates a portion of a flowchart of an exemplary method for manufacturing a PCM RF switch according to one implementation of the present application. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions. Actions 570 through 582 shown in flowchart 500 of FIG. 5 are sufficient to describe one implementation of the present inventive concepts, other implementations of the present inventive concepts may utilize actions different from those shown in the flowchart of FIG. 5.

Flowchart 500 begins with action 570 by providing a PCM and a heating element underlying an active segment of the PCM. As described above, PCM 314 can be provided along with heating element 306 underlying active segment 316 of PCM 314. Flowchart 500 continues with action 572 by forming PCM contacts connected to passive segments of the PCM. As described above, PCM contacts 320 are formed in low-k dielectric 310 and connected to passive segments of PCM 314. Flowchart 500 continues with action 574 by forming a step-wise structure of intermediate interconnect segments and vias connected to the PCM contacts. As described above, RF terminals of PCM RF switch 300A form a step-wise structure including intermediate interconnect segments 324 and 342 and vias 326 and 344, connected to PCM contacts 320.

From action 574, one implementation can continue with action 576, or an alternative implementation can continue with action 578. Where the method continues with action 576, a closed-air gap will be formed from a single dielectric deposition. Where the method continues with action 578, a closed-air gap will be formed from two dielectric depositions.

Addressing the implementation where a closed-air gap will be formed from a single dielectric deposition, action 576 includes forming a low-k dielectric having a closed-air gap therein. As described above with respect to FIG. 3A, closed-air gap 354 is formed automatically when low-k dielectric 322 is formed using a pinch-off deposition. From action 576, flowchart 500 concludes with action 582.

Addressing the implementation where a closed-air gap will be formed from two dielectric depositions, action 578 includes forming a low-k dielectric. As described above with respect to FIG. 4A, in the first dielectric deposition, low-k dielectric 421 is deposited over low-k dielectric 410, PCM contacts 420, and intermediate interconnect segments 424. From action 578, the flowchart continues with action 580 by forming a closed-air gap in the low-k dielectric. As described above with respect to FIG. 4A, closed-air gap 454 is formed by forming a trench in low-k dielectric 421, then depositing low-k dielectric 422 over low-k dielectric 421 using a pinch-off deposition. From action 580, flowchart 500 concludes with action 582.

Flowchart 500 concludes with action 582 by completing an RF clearance zone by forming setback top routing interconnects situated higher over a substrate than the PCM contacts and the intermediate interconnect segments, and connected to the intermediate interconnect segments and vias. As described above, setback top routing interconnects 346 are situated at a higher interlayer metal level than intermediate interconnect segments 324 and 342 and are connected to vias 344. RF clearance zone 358 includes the step-wise structure of intermediate interconnect segments 324 and 342 and vias 326 and 344, portions of low-k dielectrics 310, 322, and 340 and portions of passivation 348 between the RF terminals, closed-air gap 354, and open-air gap 356. No other interconnects cross over the RF terminals or PCM 314 in RF clearance zone 358.

PCM RF switches according to the present invention, such as PCM RF switch 300A, exhibit significantly reduced parasitic capacitance and improved frequency response. Because PCM RF switch 300A includes a step-wise structure of intermediate interconnect segments 324 and 342 and vias 326 and 344 to connect PCM contacts 320 to setback top routing interconnects 346, the distance between intermediate interconnect segments 324 in FIG. 3A is greater relative to the distance between intermediate interconnect segments 224 in FIG. 2A. Likewise, the distance between intermediate interconnect segments 342 in FIG. 3A is greater relative to the distance between intermediate interconnect segments 242 in FIG. 2A. Thus, the capacitance value of parasitic capacitor 350 in FIG. 3A formed between intermediate interconnect segments 342 is reduced relative to the capacitance value of parasitic capacitor 250 in FIG. 2A. Likewise, the capacitance value of parasitic capacitor 352 in FIG. 3A formed between top routing interconnect 346 is reduced relative to the capacitance value of parasitic capacitor 252 in FIG. 2A. Where additional interconnects and vias reduce the capacitance values of parasitic capacitors 332, 334, 336, and 338, but also form parasitic capacitors 350 and 352, the step-wise structure in PCM RF switch 300A significantly reduces the capacitance values of parasitic capacitors 350 and 352, without increasing the dimensions of PCM 314 or the spacing between RF-IN and RF-OUT terminals. The significantly reduced parasitic capacitance reduces a total insertion loss of PCM RF switch 300A in the ON state and reduces a total OFF state parasitic capacitance ($C_{OFF}$) of PCM RF switch 300A in the OFF state.

Because low-k dielectrics 310, 322, and 340 have a lower dielectric constant and are situated between setback top routing interconnect 346 and heating element 306, low-k dielectrics 310, 322, and 340 reduce the capacitance values of parasitic capacitors 332 and 334. Likewise, because low-k dielectrics 310, 322, and 340 are situated between setback top routing interconnect 346 and substrate 302, low-k dielectrics 310, 322, and 340 reduce the capacitance values of parasitic capacitors 336 and 338. Although not shown in FIG. 3A, parasitic capacitors are also formed between substrate 302 and intermediate interconnect segments 324 and 342, and between heating element 306 and intermediate interconnect segments 324 and 342. Low-k dielectrics 310 and 322 also reduce the capacitance values of these parasitic capacitors.

Further, because low-k dielectrics 310, 322, and 340 are situated between RF-IN and RF-OUT terminals of PCM RF switch 300A, low-k dielectrics 310, 322, and 340, in combination with the step-wise structure, further reduce parasitic capacitance between RF-IN and RF-OUT terminals. Specifically, low-k dielectric 322 further reduces the capacitance value of parasitic capacitor 330 between intermediate interconnect segments 324, and low-k dielectric 340 further reduces the capacitance value of parasitic capacitor 350 between intermediate interconnect segments 342. Low-k dielectrics 310, 322, and 340 also reduce parasitic capacitance between PCM contacts 320, vias 326, and vias 344 respectively.

Additionally, parasitic capacitor 330 generally has the highest capacitance value of parasitic capacitors 330, 350, and 352 due to the short distance between intermediate interconnect segments 324. Because PCM RF switch 300A includes closed-air gap 354 having a lower dielectric constant than low-k dielectric 322, PCM RF switch 300A further reduces the capacitance value of parasitic capacitor 330 where reduction is most needed between intermediate interconnect segments 324. Similarly, open-air gap 356 between setback top routing interconnects 346 further reduces the capacitance value of parasitic capacitor 352.

Because parasitic capacitors 330, 332, 334, 336, 338, 350 and 352 all contribute to degrading the frequency response of PCM RF switch 300A, the techniques disclosed in the present application significantly reduce the overall parasitic capacitance of PCM RF switch 300A, thereby reducing the total insertion loss of PCM RF switch 300A in the ON state and reducing the total $C_{OFF}$ of PCM RF switch 300A in the OFF state. Additionally, by utilizing RF clearance zone 358 without cross-over interconnects, no unwanted parasitics are formed, and PCM RF switch 300A maintains significantly reduced parasitic capacitance.

PCM RF switch 400A exhibits further reduced parasitic capacitance. Because intermediate interconnect segments 424 in PCM RF switch 400A have an offset away from active segment 416 of PCM 414, PCM RF switch 400A further reduces the capacitance value of parasitic capacitor 430 where reduction is most needed between intermediate interconnect segments 424. Moreover, by using two low-k dielectrics 421 and 422, closed-air gap 454 can be formed even where the offset of intermediate interconnect segments 424 creates a spacing too large for a pinch-off to automatically occur. Two low-k dielectrics can also be used in place of low-k dielectric 440 to form another closed-air gap between intermediate interconnect segments 442.

It is noted that in various drawings in the present application specific implementations showing a specific number of interconnect metal levels were illustrated. For example, FIG. 1A illustrates a single metal level, while FIGS. 3A and 4A illustrate three metal levels. However, it is apparent to one of ordinary skill in the art that the present inventive concepts can be applied to two, four, five, six or more interconnect metal levels. In fact, implementations of the present inventive concepts that are integrated with CMOS, BiCMOS, or group III-V semiconductors and processes can take advantage of the existence of an increased number of interconnect metal levels for significant improvements in metalization techniques for PCM RF switches as disclosed in the present application, only examples of which were shown in FIGS. 1A, 3A, and 4A.

Thus, various implementations of the present application achieve a method of manufacturing and a structure of a PCM RF switch that overcomes the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A phase-change material (PCM) radio frequency (RF) switch situated over a substrate, said PCM RF switch having a significantly reduced parasitic capacitance, said PCM RF switch comprising:
   an RF clearance zone comprising a step-wise structure of intermediate interconnect segments and vias to connect PCM contacts to setback top routing interconnects, said RF clearance zone not including cross-over interconnect segments;
   a low-k dielectric in said RF clearance zone;
   a closed-air gap situated in said RF clearance zone within said low-k dielectric; and
   said setback top routing interconnects situated higher over said substrate than said PCM contacts and said intermediate interconnect segments.

2. The PCM RF switch of claim 1, wherein said PCM RF switch has a reduced parasitic capacitance between RF-IN and RF-OUT terminals of said PCM RF switch.

3. The PCM RF switch of claim 1, wherein said PCM RF switch has a reduced parasitic capacitance between RF terminals and a heating element of said PCM RF switch.

4. The PCM RF switch of claim 1, wherein said PCM RF switch has a reduced parasitic capacitance between RF terminals of said PCM RF switch and said substrate.

5. The PCM RF switch of claim 1, wherein said step-wise structure of intermediate interconnect segments is a subtractively etched structure.

6. The PCM RF switch of claim 1, wherein said step-wise structure of intermediate interconnect segments is a single-damascene structure.

7. The PCM RF switch of claim 1, wherein said step-wise structure of intermediate interconnect segments is a dual-damascene structure.

8. The PCM RF switch of claim 1, wherein said low-k dielectric is selected from the group consisting of carbon-doped silicon oxide, porous silicon oxide, porous carbon-doped silicon oxide, spin-on organic polymer, spin-on silicon based polymer, fluorinated amorphous carbon, aromatic hydrocarbon, parylene, polyarylene ether, silsesquioxane, fluorinated silicon dioxide, and diamondlike carbon.

9. The PCM RF switch of claim 1, wherein said PCM RF switch further comprises an open-air gap situated between said setback top routing interconnects.

10. A radio frequency (RF) switch situated over a substrate, said RF switch having a significantly reduced parasitic capacitance, said RF switch comprising:
    a phase-change material (PCM) and a heating element underlying an active segment of said PCM;
    an RF clearance zone comprising a step-wise structure of intermediate interconnect segments and vias to connect PCM contacts to setback top routing interconnects, said RF clearance zone not including cross-over interconnect segments;
    a closed-air gap situated in said RF clearance zone; and
    said setback top routing interconnects situated higher over said substrate than said PCM contacts and said intermediate interconnect segments.

11. The RF switch of claim 10, wherein said RF switch has a reduced parasitic capacitance between RF-IN and RF-OUT terminals of said RF switch.

12. The RF switch of claim 10, wherein said RF switch has a reduced parasitic capacitance between RF terminals and said heating element of said RF switch.

13. The RF switch of claim 10, wherein said RF switch has a reduced parasitic capacitance between RF terminals of said RF switch and said substrate.

14. The RF switch of claim 10, wherein said RF switch further comprises an open-air gap situated between said setback top routing interconnects.

15. A method of manufacturing a radio frequency (RF) switch situated over a substrate, said RF switch having a significantly reduced parasitic capacitance, the method comprising:
    providing a phase-change material (PCM) and a heating element underlying an active segment of said PCM;
    forming a step-wise structure of intermediate interconnect segments and vias connected to PCM contacts;
    forming a closed-air gap in a low-k dielectric; and
    completing an RF clearance zone by forming setback top routing interconnects situated higher over said substrate than said PCM contacts and said intermediate interconnect segments, said RF clearance zone not including cross-over interconnect segments.

16. The method of claim 15, wherein said forming said closed-air gap comprises a single dielectric deposition, wherein said single dielectric deposition is a pinch-off deposition.

17. The method of claim 15, wherein said forming said closed-air gap comprises a first dielectric deposition and a second dielectric deposition, wherein said second dielectric deposition is a pinch-off deposition.

18. The method of claim 15, wherein said RF switch has a reduced parasitic capacitance between RF-IN and RF-OUT terminals of said RF switch.

19. The method of claim 15, wherein said RF switch has a reduced parasitic capacitance between RF terminals and a heating element of said RF switch.

20. The method of claim 15, wherein said RF switch has a reduced parasitic capacitance between RF terminals of said RF switch and said substrate.

* * * * *